US006687882B1

(12) United States Patent
McElvain et al.

(10) Patent No.: US 6,687,882 B1
(45) Date of Patent: Feb. 3, 2004

(54) METHODS AND APPARATUSES FOR NON-EQUIVALENCE CHECKING OF CIRCUITS WITH SUBSPACE

(75) Inventors: Kenneth S. McElvain, Los Altos, CA (US); Sanjeev Mahajan, San Francisco, CA (US)

(73) Assignee: Synplicity, Inc., Sunnyvale, CA (US)

( * ) Notice: Subject to any disclaimer, the term of this patent is extended or adjusted under 35 U.S.C. 154(b) by 45 days.

(21) Appl. No.: 10/066,093

(22) Filed: Jan. 31, 2002

(51) Int. Cl.[7] ............................................. G06F 17/50
(52) U.S. Cl. ........................ 716/3; 716/5; 716/7; 703/15
(58) Field of Search ........................ 716/5, 3, 7; 703/15

(56) References Cited

U.S. PATENT DOCUMENTS

| | | | | |
|---|---|---|---|---|
| 5,452,239 A | * | 9/1995 | Dai et al. ...................... | 703/19 |
| 5,633,813 A | * | 5/1997 | Srinivasan ................... | 703/14 |
| 5,638,381 A | * | 6/1997 | Cho et al. ..................... | 714/732 |
| 5,862,149 A | * | 1/1999 | Carpenter et al. ........... | 714/726 |
| 5,875,112 A | * | 2/1999 | Lee .............................. | 716/12 |
| 5,949,691 A | * | 9/1999 | Kurosaka et al. ............. | 716/5 |
| 6,002,861 A | * | 12/1999 | Butts et al. .................... | 703/16 |
| 6,035,107 A | * | 3/2000 | Kuehlmann et al. ........... | 716/1 |
| 6,134,705 A | * | 10/2000 | Pedersen et al. .............. | 716/18 |
| 6,163,876 A | * | 12/2000 | Ashar et al. .................... | 716/5 |
| 6,167,561 A | * | 12/2000 | Chen et al. .................... | 716/18 |
| 6,188,934 B1 | * | 2/2001 | Emura ........................ | 700/110 |
| 6,247,163 B1 | * | 6/2001 | Burch et al. .................... | 716/3 |
| 6,336,206 B1 | * | 1/2002 | Lockyear ...................... | 716/7 |
| 6,415,430 B1 | * | 7/2002 | Ashar et al. .................... | 716/18 |
| 6,449,750 B1 | * | 9/2002 | Tsuchiya ........................ | 716/4 |
| 6,457,162 B1 | * | 9/2002 | Stanion .......................... | 716/7 |
| 6,484,135 B1 | * | 11/2002 | Chin et al. ..................... | 703/23 |
| 6,490,717 B1 | * | 12/2002 | Pedersen et al. .............. | 716/18 |
| 6,496,955 B1 | * | 12/2002 | Chandra et al. ................ | 716/3 |
| 6,523,155 B1 | * | 2/2003 | Ruedinger ..................... | 716/7 |
| 6,530,072 B1 | * | 3/2003 | Hagerman et al. ............. | 716/18 |
| 6,536,018 B1 | * | 3/2003 | Chisholm et al. .............. | 716/4 |
| 6,609,234 B2 | * | 8/2003 | Kurupati ......................... | 716/7 |
| 2002/0138812 A1 | * | 9/2002 | Johannsen ....................... | 716/5 |
| 2003/0023942 A1 | * | 1/2003 | Kurupati ......................... | 716/7 |

OTHER PUBLICATIONS

Burch et al., "Robust latch mapping for combinational equivalent checking", 1998 IEEE/ACM International Conference on Computer–Aided Design, Nov. 8, 1998, pp. 563–569.*

Wohl et al., "Using ATP for clock rules checking in complex Scan Designs", 15th IEEE VLSI Test Symposium, Apr. 27, 1997, p 130–136.*

Berman et al., "Functional comparison of logic designs for VLSI circuits", 1989 IEEE International Conference on Computer–Aided Design, Nov. 5, 1989, pp. 456–459.*

Ashar et al., "Verification of RTL generated from scheduled behavior in a high–level synthesis flow", 1998 IEEE/ACM International Conference on Computer–Aided Design, Nov. 8, 1998, pp. 517–524.*

Agrawal, "Choice of tests for logic verification and equivalence checking and the use of fault simulation", Thirteenth Internation Conference on VLSI Design, Jan. 3, 2000, pp. 306–311.*

(List continued on next page.)

*Primary Examiner*—Matthew Smith
*Assistant Examiner*—Phallaka Kik
(74) *Attorney, Agent, or Firm*—Blakely, Sokoloff, Taylor & Zafman LLP (57) ABSTRACT

Methods and systems for designing integrated circuits. In one exemplary method, matched registers between the two netlists are determined. The matched registers become cut off points to generate primary inputs and outputs. When there are one or more unmatched registers between the first netlist and the second netlist, the unmatched registers are pushed to the primary inputs or outputs using retiming. At the primary inputs, a subspace generator is used to generate subspaces. The subspaces are used to identify non-equivalences between the first and second netlists. Other features and embodiments are also described.

33 Claims, 10 Drawing Sheets

OTHER PUBLICATIONS

Caporossi et al., "Rule checking at the register level", IEEE Spectrum, vol. 33, No. 6, Jun. 1996, pp. 72–73.*

Cerny et al., "Tautology checking using cross–controllability and cross–observability relations", 1990 IEEE International Conference on Computer–Aided Design, Nov. 11, 1990, pp. 34–37.*

Williams et al., "Equivalence checking of hierarchial combinational circuits", Proceedings of the 6th IEEE International Conference on Electronics, Circuits and Systems, vol. 1, pp. 355–360.*

Ribas–Xirgo et al., "On the reuse of symbolic simulation results for incremental equivalence verification of switch–level circuits", Proceedings of Design, Automation and Test in Europe, Feb. 23, 1998, pp. 624–629.*

Paruthi et al., "Equivlance checking combing a strutural SAT–solver, BDDs, and simulation", Proceedings of 2000 International Conference on Computer Design, Sep. 17, 2000, pp. 459–464.*

Joshi et al., "Design of provably correct storage arrays", Fourteenth International Conference on VLSI Design, Jan. 3, 2001 pp. 196–201.*

Lei et al., "Distinguishing variables of Boolean function via distinct subBDDs", Proceedings of 4th International Conference on ASIC, Oct. 23, 2001, pp. 141–145.*

Krohm et al., "The Use of random simulation in formal verification", 1996 IEEE International Conference on Computer Design: VLSI in Computers and Processes, Oct. 7, 1996, pp. 371–376.*

Mukherjee et al., "Automatic partitioning for efficient combinational verification", Proceedings of the ASP–DAC 2000 Asia and South Pacific Design Automation Conference, Jan. 25, 2000, pp. 67–71.*

Khasidashvili et al., "An enhanced cut–points algorithm in formal equivalence verification", Proceedings of Sixth IEEE International High–Level Design Validation and Test Workshop, Nov. 7, 2001, pp. 171–176.*

Huang et al., "Easily testable data path allocation using input/output registers", Proceedings of the Fifth Annual Test Symposium, Nov. 20, 1996, pp. 142–147.*

* cited by examiner

| $i_4$ | $i_3$ | $i_2$ | $i_1$ | $i_0$ |   | $i_4$ | $i_3$ | $i_2$ | $i_1$ | $i_0$ |
|---|---|---|---|---|---|---|---|---|---|---|
| 0 | 0 | 0 | 0 | 0 |   | 1 | 0 | 0 | 0 | 0 |
| 0 | 0 | 0 | 0 | 1 |   | 1 | 0 | 0 | 0 | 1 |
| 0 | 0 | 0 | 1 | 0 |   | 1 | 0 | 0 | 1 | 0 |
| 0 | 0 | 0 | 1 | 1 |   | 1 | 0 | 0 | 1 | 1 |
| 0 | 0 | 1 | 0 | 0 |   | 1 | 0 | 1 | 0 | 0 |
| 0 | 0 | 1 | 0 | 1 |   | 1 | 0 | 1 | 0 | 1 |
| 0 | 0 | 1 | 1 | 0 |   | 1 | 0 | 1 | 1 | 0 |
| 0 | 0 | 1 | 1 | 1 |   | 1 | 0 | 1 | 1 | 1 |
| 0 | 1 | 0 | 0 | 0 |   | 1 | 1 | 0 | 0 | 0 |
| 0 | 1 | 0 | 0 | 1 |   | 1 | 1 | 0 | 0 | 1 |
| 0 | 1 | 0 | 1 | 0 |   | 1 | 1 | 0 | 1 | 0 |
| 0 | 1 | 0 | 1 | 1 |   | 1 | 1 | 0 | 1 | 1 |
| 0 | 1 | 1 | 0 | 0 |   | 1 | 1 | 1 | 0 | 0 |
| 0 | 1 | 1 | 0 | 1 |   | 1 | 1 | 1 | 0 | 1 |
| 0 | 1 | 1 | 1 | 0 |   | 1 | 1 | 1 | 1 | 0 |
| 0 | 1 | 1 | 1 | 1 |   | 1 | 1 | 1 | 1 | 1 |

METHODS AND APPARATUSES FOR NON-EQUIVALENCE CHECKING OF CIRCUITS WITH SUBSPACE

FIELD OF THE INVENTION

The present invention relates generally to the field of circuit design. More specifically, the invention relates to the design of integrated circuits which may be modified or optimized during a design process.

BACKGROUND OF THE INVENTION

For the design of digital circuits on the scale of VLSI (Very Large Scale Integration) technology, designers often employ computer-aided techniques. Standard languages such as hardware description languages (HDLs) have been developed to describe digital circuits to aid in the design and simulation of complex digital circuits. Several hardware description languages, such as VHDL and Verilog, have evolved as industry standards. VHDL and Verilog are general-purpose hardware description languages that allow definition of a hardware model at the gate level, the register transfer level (RTL), or the behavioral level using abstract data types. As device technology and design technology continues to advance, various product design tools have been developed to adapt HDLs for use with newer devices and design styles and to also allow for the optimization of a design after the compilation of an HDL code which describes a particular circuit.

Figure 1:
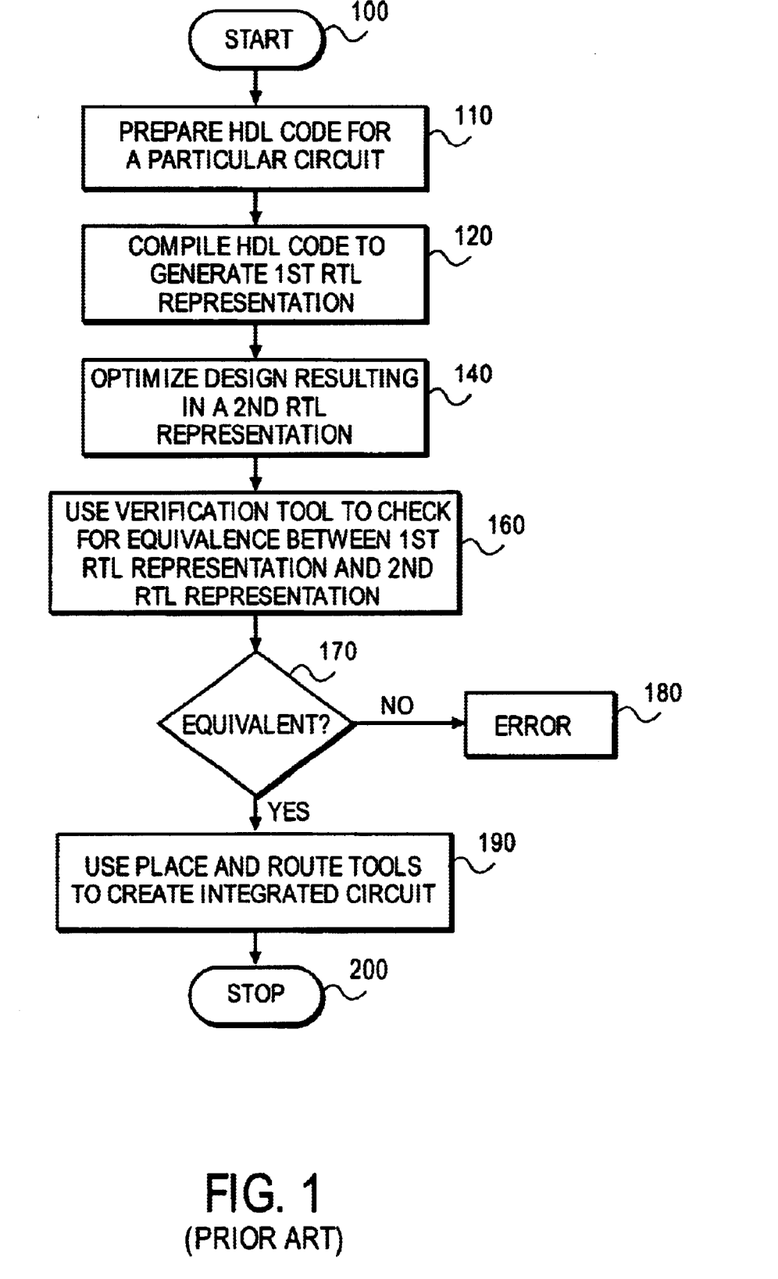
FIG. 1 is a flow chart illustrating a prior art process for designing integrated circuits.

FIG. 1 illustrates an example in the prior art in which a circuit is initially designed and then optimized in the design process. The optimized design typically must be compared with the original design to verify that the optimized design is equivalent to the initial or original design. This is often required because the optimization process may result in a change to the design which causes the second design (e.g. an optimized design) to not be an equivalent circuit such that the optimized design does not produce the same result for a given input as the initial design.

The process of FIG. 1 starts at block 100. At block 110, an HDL code is prepared for a particular circuit. This code is typically compiled in an HDL compiler to generate a first RTL netlist, as shown in block 120. Then at block 140, the first RTL netlist is processed in order to optimize the design which results in a technology map. The optimization process may include, for example, redundancy removal, state machine re-encoding, flip-flop replication, retiming, pipelining, half-cycle scheduling, and conversions between clock gating and enables.

At block 160, a verification tool, such as a commercially available verification software product, is used to check for equivalence between the first RTL netlist and the technology map. At block 170, the use of this tool results in a test to determine whether the two netlists are equivalent. If these two netlists are not equivalent, this results in an error message being displayed to the designer by the verification tool, as shown in 180. On the other hand, if the verification tool can verify that the two netlists are equivalent, then an indication of this equivalence is displayed to the designer and the process may proceed to block 190 in which place and route tools are used to create an integrated circuit from the technology map. The process stops at block 200.

Figure 2A:
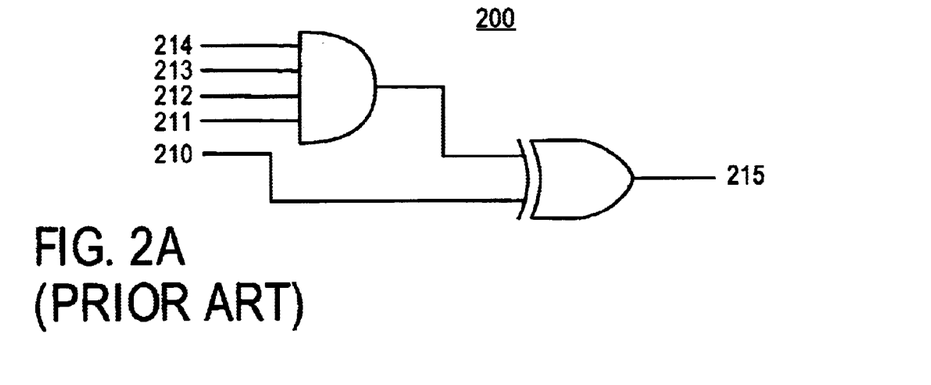
FIG. 2A and FIG. 2B illustrate an example of a circuit used to test for non-equivalence and the corresponding input vectors.
Figure 2B:
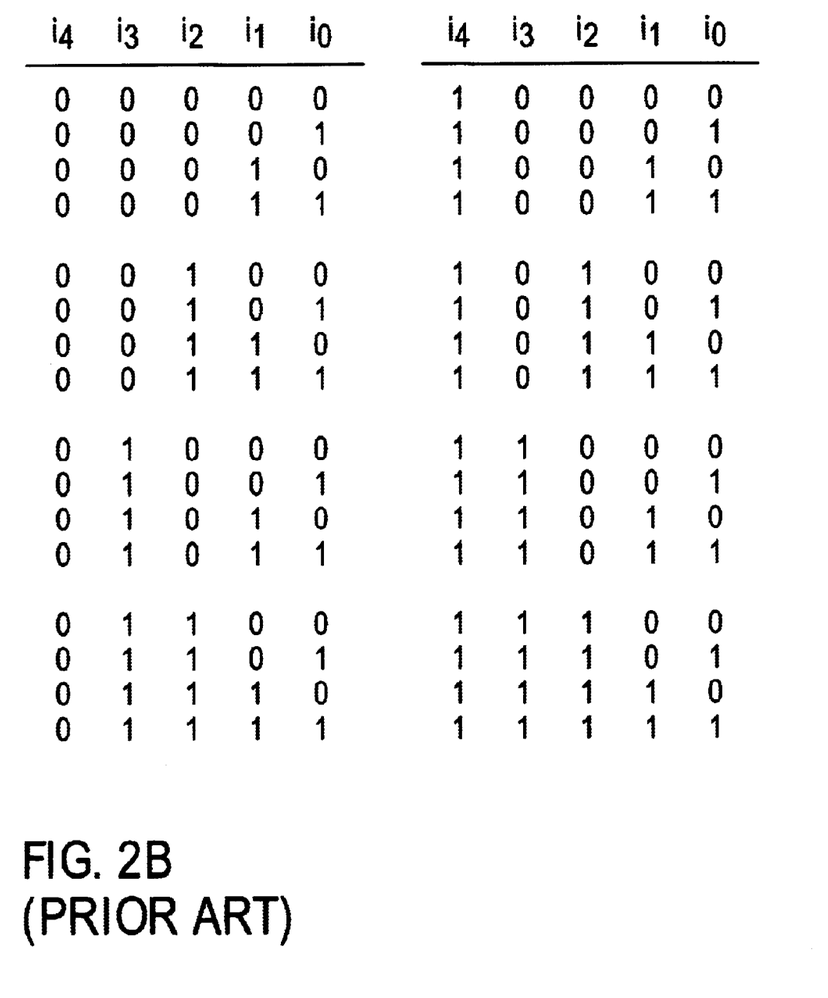

Typically in the prior art, the equivalence checking of the first RTL representation and the mapped representation performed in block 160 requires an exhaustive simulation of the circuits by going through all possible input vectors. FIG. 2A illustrates an example of a circuit used to test for non-equivalence. The circuit 200 includes five (5) inputs 210–214 and one output 215. FIG. 2B is a truth table illustrating the 32 input vectors for the circuit 200. Equivalence checking tools that are commercially available include Formality from Synopsis, Mountain View, Calif., Crysalys from Avant!, Fremont, Calif., Formal Pro from Mentor Graphics, Wilsonville, Oreg., Conformal from Verplex, Milpitas, Calif., etc. When the circuit has a large number of input vectors, the testing of the circuit using all of the input vectors can require a lot of memory and be very time consuming.

SUMMARY OF THE INVENTION

According to one aspect of the present invention, an exemplary method for determining non-equivalence between two netlists is disclosed. Matched registers between the two netlists are determined. The matched registers become cut off points to generate primary inputs and outputs. When there are one or more unmatched registers between the first netlist and the second netlist, the unmatched registers are pushed to the primary inputs or outputs using retiming. The primary inputs of the resulting circuits after using retiming are then driven by a function of subspace variables. The circuits are then verified with all possible values of the subspace variable.

The present invention also discloses apparatuses, including software media which may be used to design integrated circuits. For example, the present invention includes digital processing systems which are capable of designing integrated circuits according to the present invention, and the invention also includes machine readable media, which when executed on a digital processing system such as a computer system, causes the digital processing system to execute a method for designing integrated circuits.

Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings in which like references indicate similar elements.

DETAILED DESCRIPTION

In one embodiment of the present invention, a method of non-equivalence checking of a reference netlist and a test netlist is disclosed. The reference netlist and the test netlist are compared to determine matched registers. The matched registers become cutoff points to form primary inputs and outputs for resulting circuits. When there are one or more unmatched registers between the reference netlist and the test netlist, the unmatched registers are pushed to the primary inputs or outputs using retiming. The primary inputs of the resulting circuits are then driven by a function of subspace variables.

Methods and apparatuses for designing an integrated circuit are described herein. In the following description, for purposes of explanation, numerous specific details are set forth to provide a thorough understanding of the present invention. It will be evident, however, to one skilled in the art that the present invention may be practiced without these specific details. In other instances, well known structures, processes, and devices are shown in block diagram form or are referred to in a summary manner in order to provide an explanation without undue detail.

Figure 3:
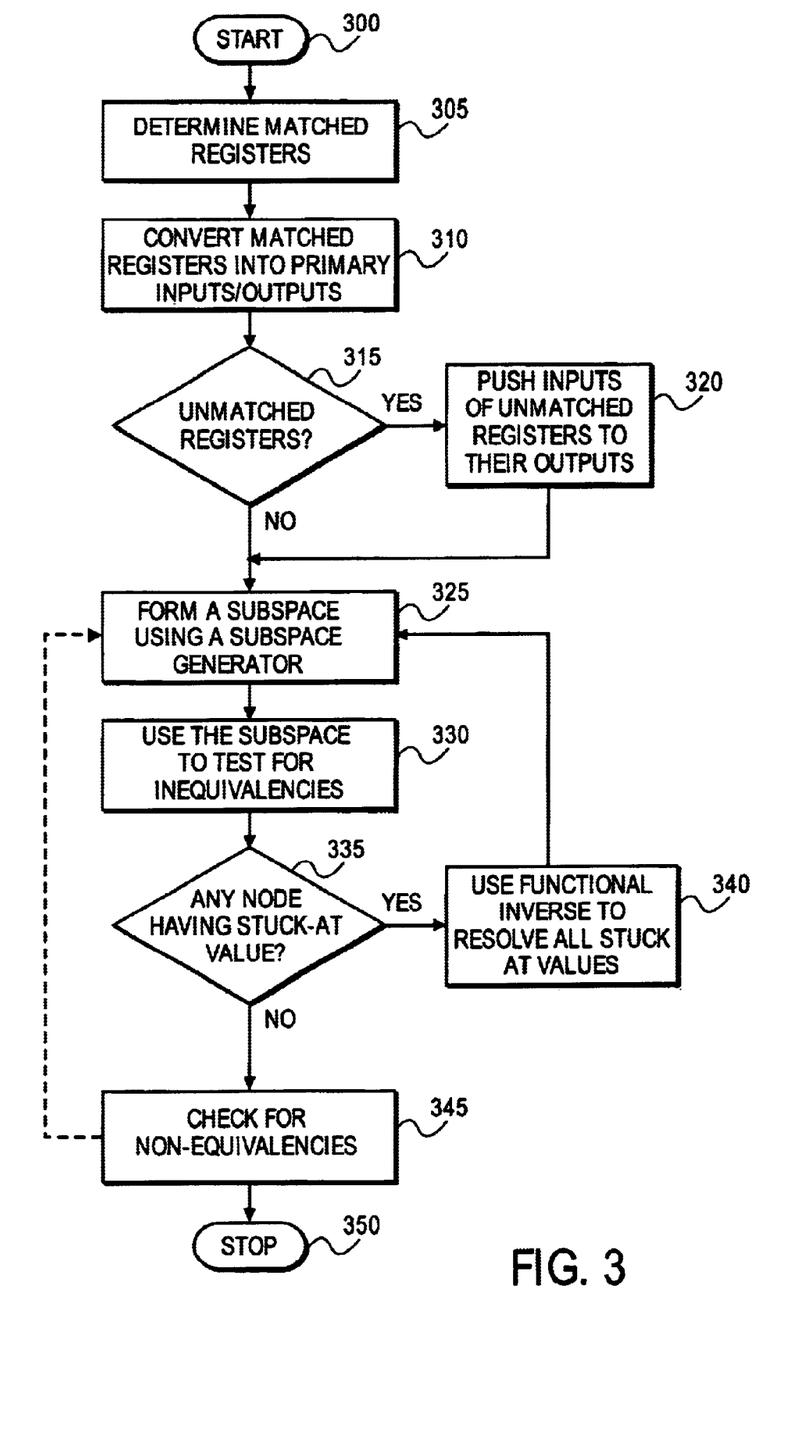
FIG. 3 is a flow diagram illustrating an exemplary process of determining non-equivalences between a reference netlist and a test netlist.

A general example of certain embodiments of the present invention will now be provided while referring to FIG. 3. While most embodiments of the present invention are intended for use in conjunction with HDL design synthesis software, the invention is not necessarily limited to such use. Although use of other languages and computer programs is possible, embodiments of the present invention will be described in the context of the use in HDL software systems, particularly those designed for use with integrated circuits, which are synthesized with HDL software tools. Further, the present invention may be used with field programmable gate arrays, which often have particular target architectures which are determined by suppliers of the programmable chips, or the invention may be used with application specific integrated circuits (ASIC) in designing such circuits.

FIG. 3 is a flow diagram illustrating an exemplary process of determining non-equivalences between a reference netlist and a test netlist. The reference netlist may be a result of a compilation of a description of a circuit provided in an HDL description. The test netlist may be an optimized version of the reference netlist using an optimizer. During the optimization process, a list of changes made to the reference netlist is maintained by the synthesis software tool so that points in the test netlist are known to have a determined relationship relative to and corresponding to the points in the reference netlist.

An optimization may be a single optimization process or multiple optimization processes which are performed sequentially over time in order to optimize the circuit. In each case, according to the invention, a list of changes made during the optimization process is maintained so that points in the test netlist can be determined to have a determined relationship relative and corresponding to points in the reference netlist. These determined relationships are used to determine matching registers as described further below.

The method of FIG. 3 starts at block 300. At block 305, matched registers between a reference netlist and a test netlist are determined. It may be noted that the matching of the registers between the reference netlist and the test netlist is not specifically limited to matching individual registers or flip-flops. Rather, a generalized concept of matching one set of registers in one netlist with another set of registers in another netlist is used. For example, a state machine with four states (4 flip-flops) may be equivalent with a state machine with two states (2 flip-flops). This information may have been left behind by the optimizer that converts the reference netlist to the test netlist, as described above.

At block 310, the matched registers are converted to primary inputs and outputs. That is, the matched registers are removed from the reference netlist and the test netlist, and each of the matched registers becomes a cut off point creating primary inputs and outputs. These primary inputs and outputs are used to check for non-equivalences between the circuits in the reference netlist and the corresponding circuits in the test netlist. In this manner, the reference netlist may produce multiple circuits resulting from the cuts, and similarly, the test netlist may produce multiple circuits resulting from the cuts. Each portion of the reference netlist corresponds to a particular portion of the test netlist, and thus there are pairs of reference and test circuits, and each pair is verified for non-equivalence.

At block 315, a determination of unmatched registers between the reference netlist and the test netlist is made. When there are unmatched registers, the process flows to block 320. In one embodiment, the inputs of the unmatched registers are pushed to their outputs using the concept of retiming. Retiming is a technique for redistributing registers in synchronous circuits to improve performance of the circuit without affecting the behavior of the circuit. The concept of retiming is known to one skilled in the art.

An alternate to using retiming is to pass the function through and relabel the variables. For example, the inputs of the unmatched registers at a prior clock cycle are pushed through and stored at the output of the unmatched registers. The input variables (e.g., A and B) are then relabelled forming a new set of variables (e.g., A' and B'). From block 320, the process flows to block 325.

At block 325, a subspace generator is placed at the primary inputs to generate one or more subspaces. A subspace is a subset of all possible input patterns. The subspace generator forms a subspace by using a small number of input variables. For example, for a circuit with 32 input variables having $2^{32}$ possible input patterns, a subspace of these $2^{32}$ input patterns may include 1024 input patterns. This subspace may be generated by the subspace generator using ten (10) input variables because $2^{10}$=1024. The size of the subspace or the number of input patterns in the subspace determines the number of input variables to be used with the subspace generator. Thus, with a subspace that has a good coverage of the circuits and that requires a small number of input variables, it is possible to bound the runtime and the memory consumption, as compared to the expense of performing an exhaustive equivalence check.

In one embodiment, multiple subspaces may be formed using a subspace search. One way to perform the subspace search is to take an initial subspace and evaluate its quality at various nodes in the circuit. Quality of a subspace is determined by measuring its coverage of nodes in the circuits. For example, one way to determine the quality of a subspace is to measure toggle activities at all the nodes in the circuits.

When the number of primary inputs is large, using the small number of input variables in the subspaces will allow non-equivalence between the circuits to be identified faster. Although having smaller number of input variables may prevent the test of the circuits to identify all of the non-equivalences, when more distinct subspaces are used most of the non-equivalences may be identified.

At block 330, the subspace formed in block 325 is used to test the circuits for non-equivalences. The test is performed using the standard equivalence checking techniques with a smaller set of input variables. Although the subspace generator is described in this example, other methods or subspace functions may also be used (e.g., random grouping of primary inputs, etc.) to form or build the subspaces to test the circuits without having to perform an exhaustive test using of all the possible input variables. Depending on the methods or subspace functions used to form the subspaces, it may be advantageous to keep the number of input variables small (e.g., less than 20) to provide fast non-equivalence checking.

Given a particular subspace, certain nodes in the circuit may be stuck at "0" or "1", and as such, any potential failure of logic in the nodes may not be detectable. At block 335, a determination of nodes having stuck-at values is made. A node having a stuck-at value has its output stay at the same value even though all of the possible input patterns for a given subspace are used. That is, the output value of the node does not toggle and remains at either "0" or "1" regardless of the subspace generator input patterns in the subspace.

When one or more nodes in the circuit experience stuck-at values, the subspace cannot produce a valid non-equivalence check and is considered defective. It may therefore be necessary to search for another subspace that will toggle all of the nodes. In one embodiment, a functional inverse of a function of the node having a stuck-at value is used to toggle the node, as shown in block 340. For example, when a node having a function "H" experiences a stuck-at value at the output, an inverse function "$H^{-1}$" can be formed such that the outputs of the inverse function "$H^{-1}$" is fed to the input of the function "H". This allows the input of the inverse function "$H^{-1}$" to pass through the combination of the inverse function "$H^{-1}$" and the function "H". This passing through of the input of the inverse function "$H^{-1}$" will cause the output of the function "H" to toggle when the input of the inverse function "$H^{-1}$" is toggled. Using the inverse function technique minimizes the number of variables involved in toggling the node having the stuck-at value.

Other techniques may also be used to search for a subspace that can toggle a node having a stuck-at value. For example, using satisfying assignment, different input patterns may be formed and tested to identify one input pattern that causes the node to toggle. It is then necessary to confirm that this input pattern is included in a new subspace.

Having all the nodes toggle is one factor in measuring the quality of a subspace. Another factor in measuring the quality of the subspace is, in addition to having all the nodes toggle, whether the effect of the toggles can be observed at the output. This is referred to as fault detection analysis. Fault detection analysis identifies whether logic in a node between the inputs and the outputs is sensitive to a change to an input value. For example, when setting an input of a node to a value, the output of the node can be observed to see the effect of the toggle.

From block 340, the process flows back to block 325 where a new subspace is formed using the inputs of the inverse function as input variables. From block 335, when none of the nodes experience any stuck-at value, the process flows to block 345 to check for non-equivalences between the circuits. The process of FIG. 3 may continue from block 345 to block 325 using other subspaces generated by the subspace generator. The process of FIG. 3 stops at block 350. In one embodiment, the non-equivalence checking process described in FIG. 3 may be used to provide a quick check for non-equivalence between the reference circuit and the test circuit, before performing a complete exhaustive equivalence check using the prior art method.

Figure 4A:
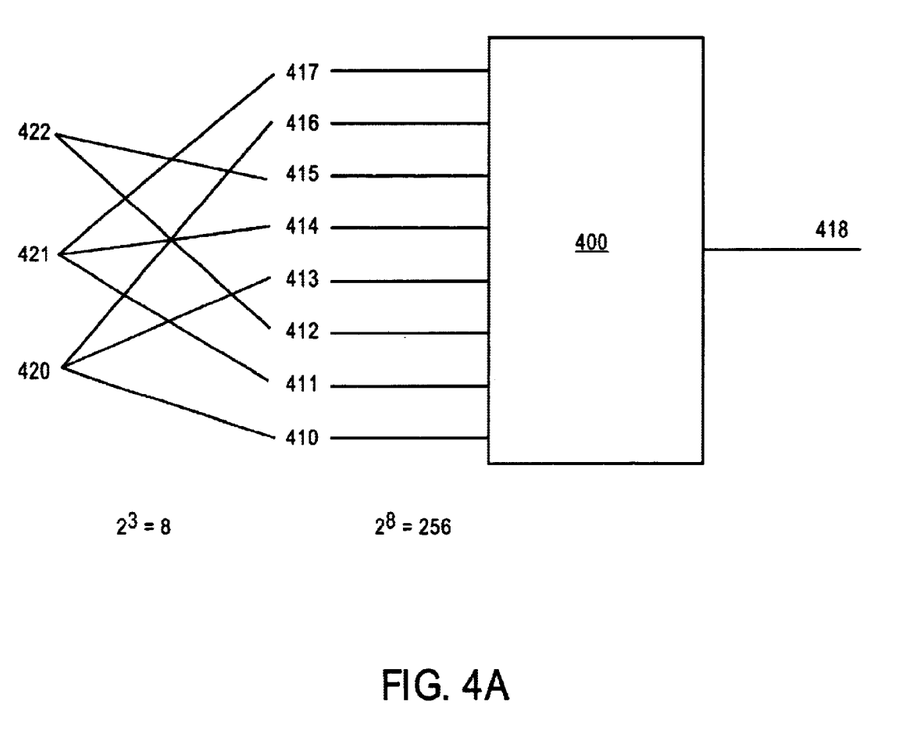
FIG. 4A is a diagram illustrating an example of a subspace.

FIG. 4A is a diagram illustrating an example of forming a subspace using bridging. In this example, the function of the circuit 400 having eight (8) primary inputs 410–417 is to be tested. The circuit 400 has an output 418. A subspace is formed by bridging every third primary input together. Thus, the primary inputs 410, 413, and 416 are bridged together to form a first group 420. The primary inputs 411, 414 and 417 are bridged together to form a second group 421. The primary inputs 412 and 415 are bridged together to form a third group 422. The groups 420, 421, and 422 together form the input variables for the subspace. The number of input variables in the subspace is reduced from eight (8) down to three (3) and the number of input vectors/patterns is reduced from $2^8=256$ down to $2^3=8$. It is faster to test the function of the circuit 400 and to identify non-equivalence (with its corresponding circuit) using eight (8) input vectors instead of using 256 input vectors. Bridging the primary input variables is one simple example to form a subspace. However, other methods of forming subspaces may also be used. For example, a subspace generator may be used to generate different subspaces to test circuits for non-equivalence.

Figure 4B:
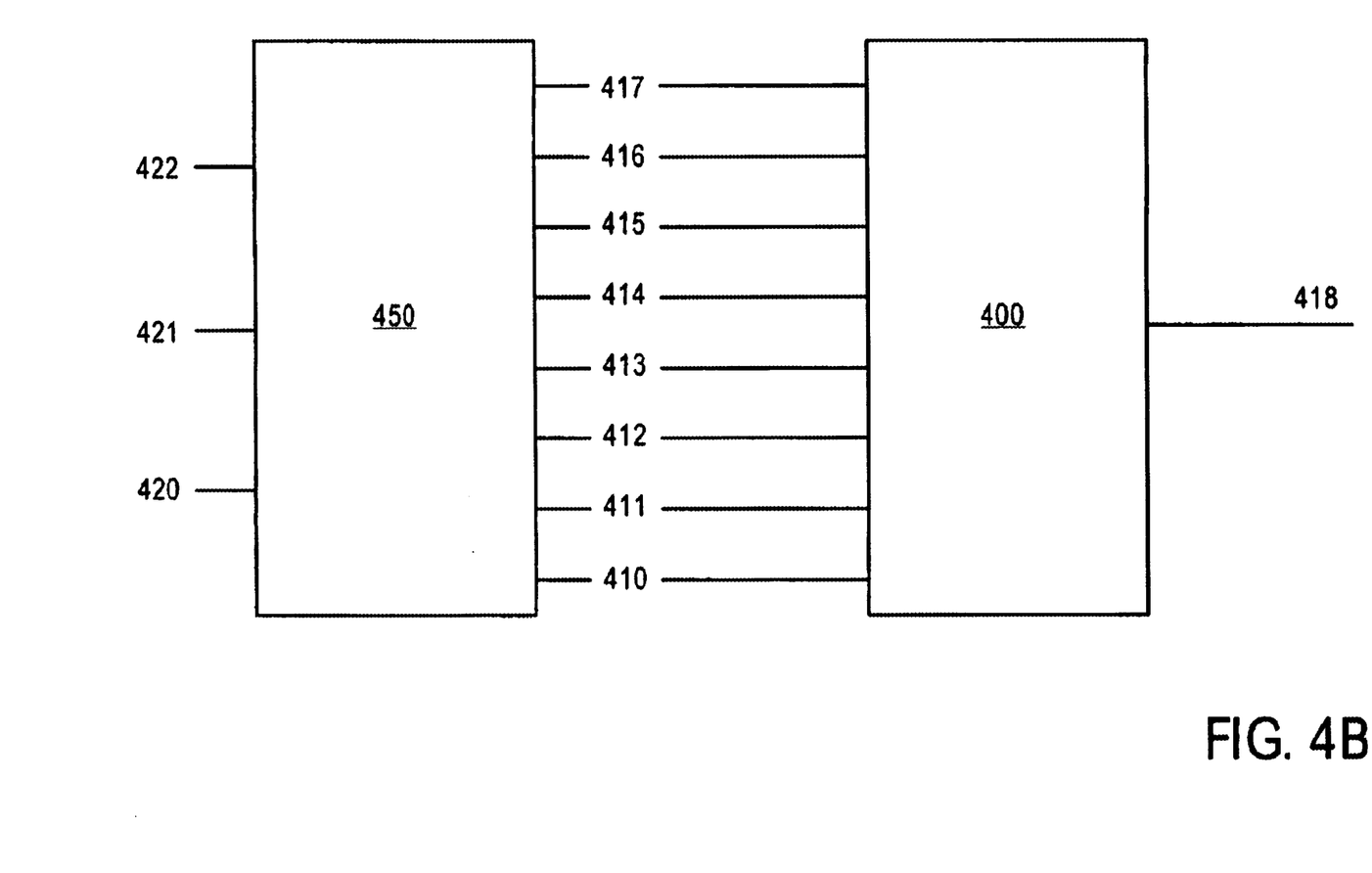
FIG. 4B is a diagram illustrating an example of a subspace generator.

FIG. 4B is a diagram illustrating an example of a subspace generator that can be used with the circuit in FIG. 4A. The subspace generator 450 uses a small set of input variables (e.g., three) to generate a subspace having $2^3=8$ input patterns for the circuit 400. The subspace generator 450 may include logic to form different subspaces.

Figure 5A:
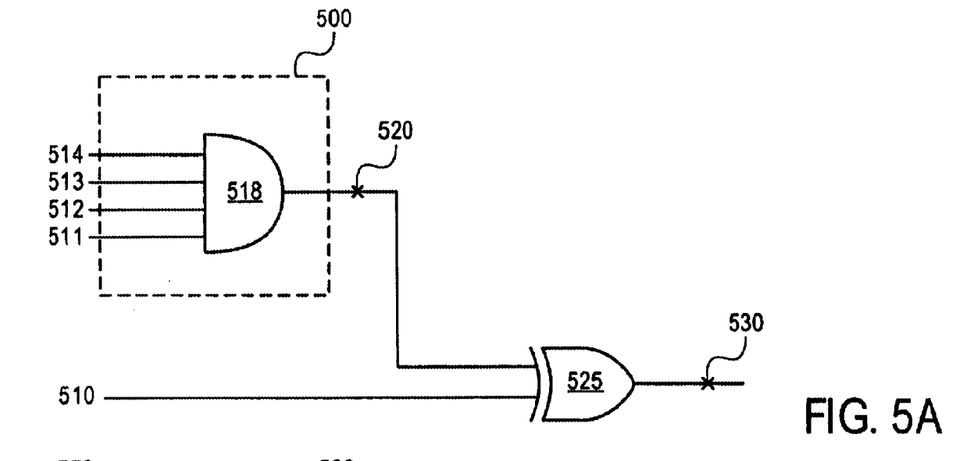
FIG. 5A illustrates an example of a circuit having a stuck-at value.

FIG. 5A illustrates an example of a circuit having a stuck-at value as described above in blocks 335 and 340 in FIG. 3. The circuit in FIG. 5A includes an XOR gate 525 with two inputs 510, 520 and an output 530. The circuit also includes an AND gate 518 having four inputs 511–514, and an output 520, together referred to as circuit or node 500. In the circuit 500, the input 511 is an inverted value of the input 514 causing the output 520 of the AND gate 518 to be stuck at zero. This stuck-at value may prevent some functionalities of the circuit in FIG. 5A to be fully tested. For example, the input 520 to the XOR gate 525 is always zero causing the output 530 to be entirely dependent on the input 510.

Figure 5B:
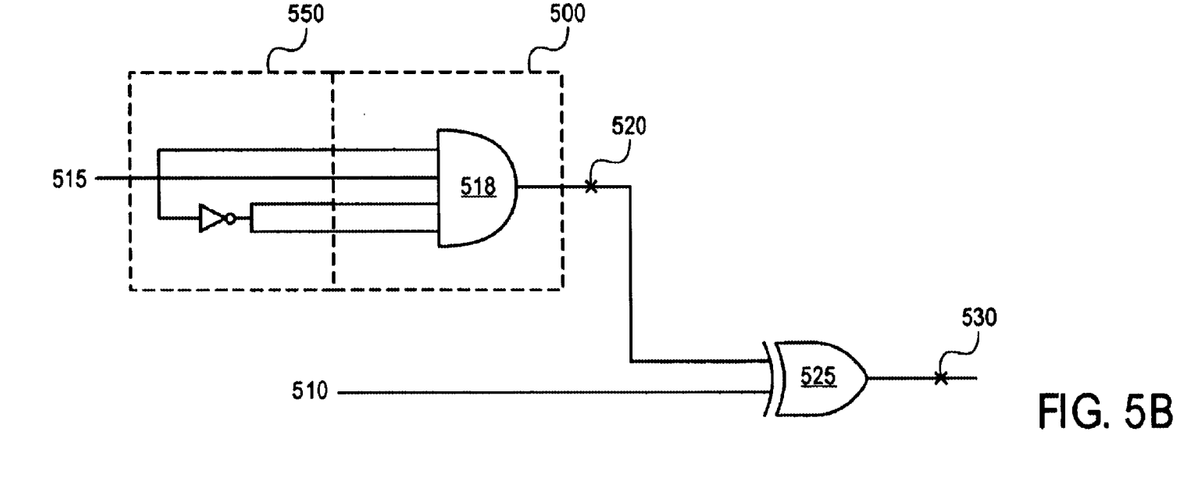
FIG. 5B is an example of an inverse circuit of the circuit 500 illustrated in FIG. 5A and used together with the circuit 500 to resolve the stuck-at value problem.

FIG. 5B is an example of an inverse circuit of the circuit 500 illustrated in FIG. 5A and used together with the circuit 500 to resolve the stuck-at value problem. The inverse circuit 550 has a single input (or variable) 515 and four outputs 511–514 such that the four outputs of the inverse circuit 550 have the same signal values as the four inputs of the circuit 500. The inverse circuit 550 computes an appropriate function that simply cancels the function of the circuit 500. As such, by toggling the input 515 of the inverse circuit 550, the output 520 of the circuit 500 is also toggled. Note that there may be multiple nodes in a circuit having stuck-at values of zeros or ones and have to be resolved. Although the inverse function method is described here to resolve the stuck-at values, other methods may also be used to cause the stuck-at values to toggle. For example, using satisfying assignment, a search may be performed to find an input vector that causes the node to toggle. A new subspace that includes this input vector may then be generated.

The non-equivalence checking method described above applies for circuits without loop backs or for circuits with loop back when there is at least one matched register between the reference circuit and the test circuit. In situations where there are circuits with loops and without matched registers, the circuit is approximated using a combinatorial circuit by essentially unrolling the function of the sequential circuit over multiple clock cycles. The technique of unrolling is typically used for test pattern generations, but is applied herein for equivalence checking.

Using the unrolling technique, the reference circuit and the test circuit are virtually iterated out over several clock cycles to multiple sheets. The number of clock cycles depends upon the number of clocked registers within the circuit. The iteration over multiple clock cycles causes the unmatched registers, such as flip-flops, to become connections from one sheet to another sheet. A first sheet represents the circuit in its initial state where all the flip-flops start out with initial known values provided by an initialization sequence. The other sheets represent copies of the circuit in subsequent clock cycles. In verifying equivalence, if the primary outputs from the test circuit fail to match the primary outputs of the reference circuit, then the two circuits are not equivalent. However, if the primary outputs of the test circuit match with the primary outputs of the reference circuit, then all possible input vectors in a subspace including the initialization sequence value as one input vector are used to verify that the test circuit is equivalent to the reference circuit. It will be understood that equivalence between the two circuits means that for all possible valid input values and states, the test circuit produces the same primary output values as the reference circuit for a given input vector applied to both circuits.

As an example, one way to view this is to consider having multiple sheets of the schematics of the reference and test circuits and stack them on top of another to cover a course of several clock cycles. In one embodiment, the flip-flops that have feedback loop are replaced with a multiplexer controlled by its clock. The output of the multiplexer crosses from one schematic sheet to a next schematic sheet up the stack. Each wire crossing between sheets represents a clock cycle delay. Each schematic sheet corresponds to a clock cycle over the course of several clock cycles and represents one time point. The result is a combinatorial circuit that starts at the input at various times and goes to the output at various times. The resulting combinatorial circuit does not have any flip-flop.

Figure 6A:
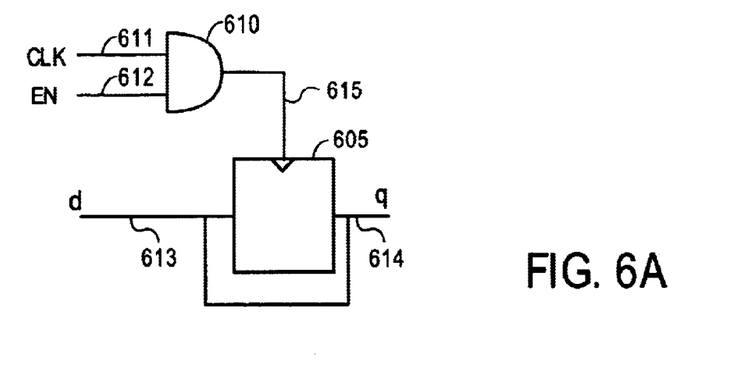
FIG. 6A illustrates an example of a sequential circuit with feedback loop.
Figure 6B:
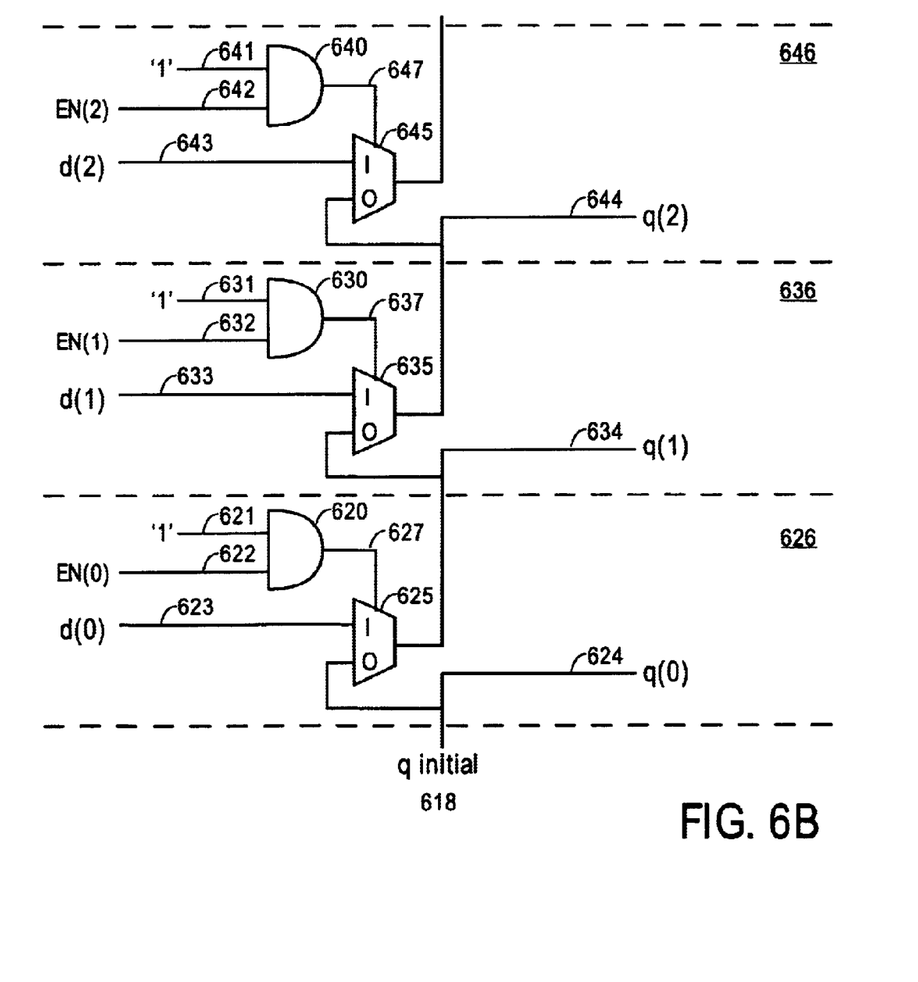
FIG. 6B illustrates an example of a combinatorial circuit corresponding to the sequential circuit of FIG. 6A unrolled over several clock cycles.

FIGS. 6A and 6B illustrate one example of applying an unrolling technique to a sequential circuit over multiple clock cycles. FIG. 6A illustrates a sequential circuit having a flip-flop with a gated clock. The sequential circuit 600 includes a flip-flop 605 and an AND gate 610. The input signals to the AND gate 610 includes the clock (CLK) signal 611 and an Enable (EN) signal 612. The state of the flip-flop 605 is controlled by the signal 615 from the AND gate 610. When the signal 615 is "1", the output q 614 has the same value as the input d 613.

FIG. 6B is an iterated schematic of the sequential circuit illustrated in FIG. 6A over three clock cycles. The schematic in FIG. 6B includes three sheets 626, 636, and 646, with the sheet 626 reflecting the state of the circuit in FIG. 6A in a first clock cycle and the sheet 646 reflecting the state of the circuit in a third clock cycle. The multiplexers 625, 635, and 645 replace the flip-flop 605 in FIG. 6A at each of the three clock cycles respectively. The select lines 627, 637, and 647 of the multiplexers 625, 635, and 645 respectively correspond to the control signal 615 of the flip-flop 605 in FIG. 6A. The CLK signal 611 that goes to the AND gate 610 in FIG. 6A is replaced by the value "1" and shown as the signals 621, 631, and 641.

The output value of the multiplexer 625 goes from the first sheet 626 to the second sheet 636 and is used in the second sheet 636 as an input to the multiplexer 635. Similarly, the output value of the multiplexer 635 goes from the second sheet 636 to the third sheet 646 and is used in the third sheet 646 as input to the multiplexer 645. Each of the outputs of the multiplexers 625, 635, and 645 corresponds to the output q 614 or state of the flip-flop 605 in FIG. 6A. The q initial 618 is an initialization sequence value.

Figure 7A:
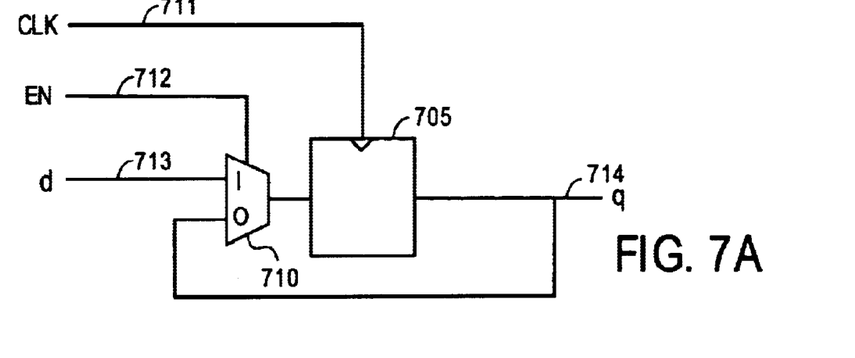
FIGS. 7A and 7B illustrate another example of applying the unrolling technique to a different sequential circuit over multiple clock cycles.
Figure 7B:
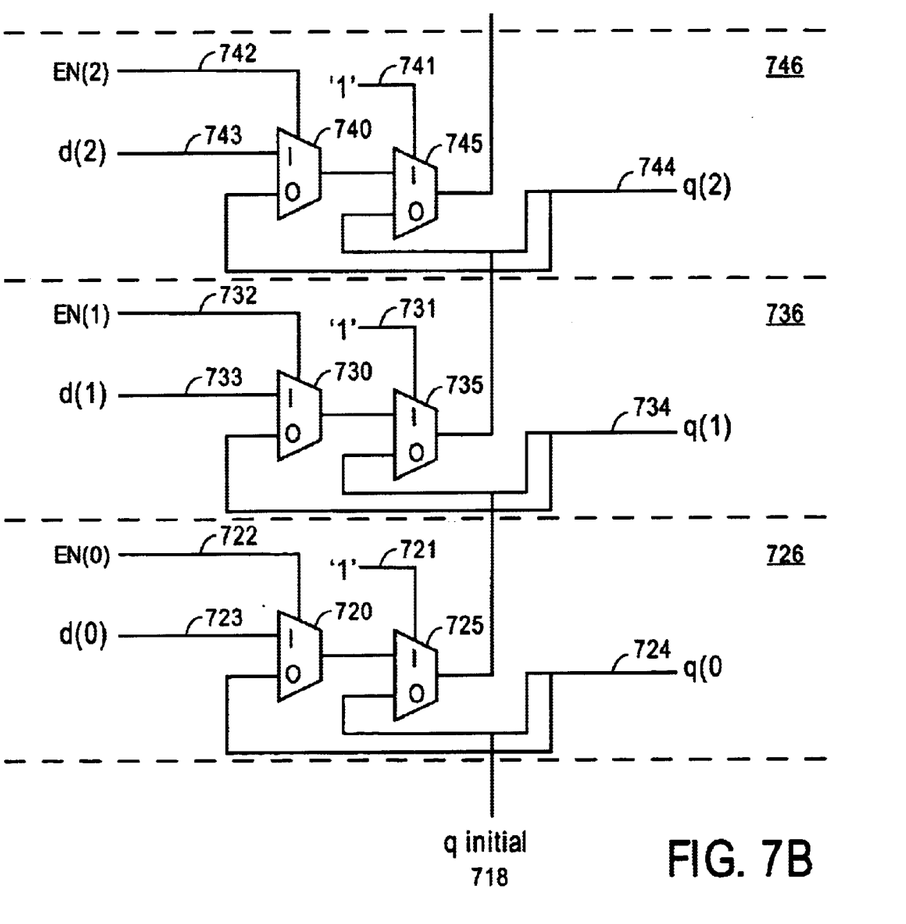

FIGS. 7A and 7B illustrate another example of applying the unrolling technique to a different sequential circuit over multiple clock cycles. FIG. 7A illustrates a sequential circuit with a multiplexer and a flip-flop. The circuit includes a flip-flop 705 and a multiplexer 710. The CLK signal 715 is a select line for the flip-flop 705. The Enable signal 712 is a select line for the multiplexer 710. The input to the multiplexer 710 includes the signal d 713 and a loop back signal from the output q 714 of the multiplexer 705.

FIG. 7B is an iterated schematic of the sequential circuit illustrated in FIG. 7A over three clock cycles. The schematic in FIG. 7B includes three sheets 726, 736, and 746, with the sheet 726 reflecting the state of the circuit in FIG. 7A in a first clock cycle and the sheet 746 reflecting the state of the same circuit in a third clock cycle. The multiplexers 720, 730, and 740 correspond to the multiplexer 710 in FIG. 7A at each of the three clock cycles respectively. The same correspondence applies to the input signals d(0) 723, d(1) 733, and d(2) 743, and the Enable signals EN(0) 722, EN(1) 732, and EN(2) 742.

The multiplexers 725, 735, and 745 replace the flip-flop 705 in FIG. 7A at each of the three clock cycles. The CLK signal 711 of the flip-flop 705 in FIG. 7A is replaced by the select lines 721, 731, and 741 of the multiplexers 725, 735, and 745 and is set to the value "1". The output signal of the multiplexer 725 goes from the first sheet 726 to the second sheet 736 and is used in the second sheet 736 as an input signal to the multiplexers 730 and 735. Similarly, the output signal of the multiplexer 735 goes from the second sheet 736 to the third sheet 746 and is used in the third sheet 746 as input to the multiplexers 740 and 745. Each of the output signals of the multiplexers 725, 735, and 745 corresponds to the output "q" 714 or state of the flip-flop 705 in FIG. 7A at each of the three clock cycles. The q_initial 718 is an initialization sequence value.

Using the unrolling technique as illustrated in FIGS. 6B and 7B, it can be shown that the two sequential circuits illustrated in FIGS. 6A and 7A are equivalent. In FIG. 7B, since the select signals 721, 731, and 741 (which replace the CLK signal 711 in FIG. 7A) are set to "1", the multiplexers 725, 735, and 745 can be simplified away and replaced as wire connections. In FIG. 6A, since the CLK signal 611 is a gated by the AND gate 610, the multiplexers 625, 635, and 645 in FIG. 6B cannot be simplified and replaced as wire connections. Thus after transformation, the sequential circuits in FIGS. 6A and 7A are considered equivalent. Although flip-flops are used in FIGS. 6A and 7A, the unrolling technique described above may also be applied to transparent latches.

Figure 8:
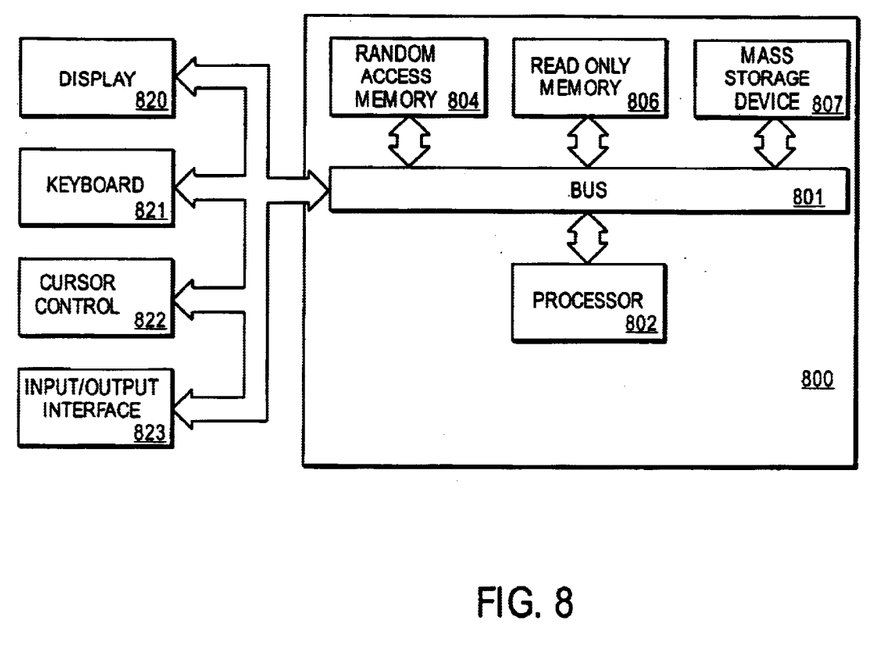
FIG. 8 is a block diagram of a digital processing system that may be used to implement embodiments of the present invention.

Many of the methods of the present invention may be performed with a digital processing system, such as a conventional general-purpose computer system. FIG. 8 illustrates a block diagram of a computer system that may be used to implement embodiments of the present invention. The computer system 800 is used to perform logic synthesis of a design that is described in an HDL code in one embodiment. This HDL code may describe a circuit for construction in a field programmable gate array or in an ASIC (application specific integrated circuit). The computer system 800 includes a processor 805, which is coupled through a bus 810 to a random access memory 815 and to a read-only memory 820 and a mass storage device 825. Mass storage device 825 represents a persistent data storage device such as a floppy disk drive, a fixed disk drive (e.g. magnetic drive, optical drive, or the like).

Processor 805 may be embodied in a general-purpose processor (such as the Intel Pentium processors), a special purpose processor or a specially programmed logic device. Display 830 is coupled to the processor 805 through bus 810 and provides graphical output for the computer system. This graphical output is typically a graphical user interface, which may be used to control the operation of the computer system 800. Keyboard 835 and cursor control device 840 are coupled to the bus 810 for communicating information and command selections to processor 805. The cursor control device 840 may be a mouse or other cursor control device, which will be used to control a cursor displayed on the display device 830. Also coupled to the processor 805 through bus 810 is an input/output interface 845 which can be used to control and transfer data to and from electrical devices such as printers and other computers, which are coupled, to the computer system 800.

It should be noted that the architecture of FIG. 8 is provided for purposes of illustration only and that a computer system or other digital processing system used in conjunction with the present invention is not limited to this specific architecture.

Figure 9:
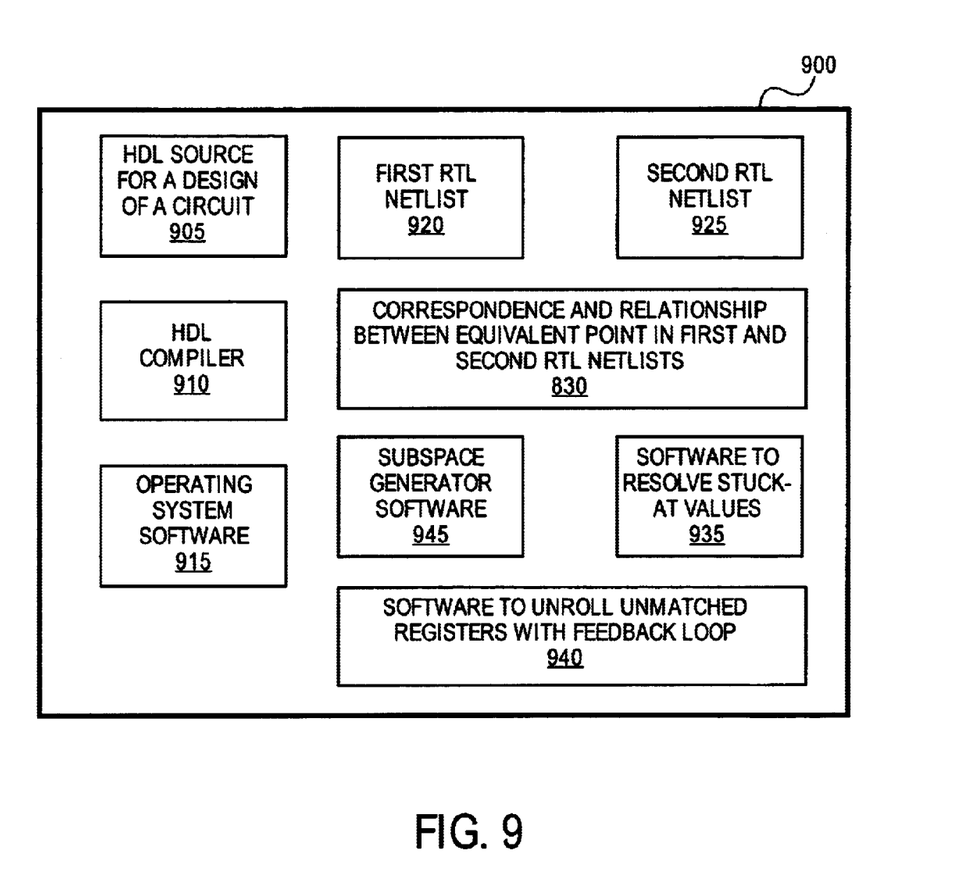
FIG. 9 illustrates an example of a machine-readable media according to one embodiment of the present invention.

One embodiment of the present invention may be a circuit design and synthesis computer-aided design software that is implemented as a computer program which is stored in a machine readable media, such as a CD-ROM or a magnetic hard disk or an optical disk or various other alternative storage devices. FIG. 9 illustrates an example of such media 900. In the example shown in FIG. 9, a source code HDL file 905 is stored in the memory or media and, after compilation of the source code, a reference RTL netlist 920 is also stored in the media 900. After at least one modification of the circuit represented by the reference RTL netlist, a test RTL netlist 925 is stored in the media. The media 900 includes conventional operating system software 915 in certain embodiments, and typically also includes an HDL compiler 910 which performs the compilation of the HDL source to produce the reference RTL netlist 920 and the test RTL netlist 925.

The media 900 includes data 930 which stores the correspondence and relationship between the equivalent points in the reference RTL netlist 920 and the test RTL netlist 925. These equivalent points may be, for example, the matched registers between the reference RTL netlist 920 and the test RTL netlist 925. The media 900 may include executable instructions 935 which when executed by a processor determine and resolve stuck-at values by, for example, generating inverse function circuits. The media 900 may also include unrolling instructions 940 and subspace generator instructions 945.

In a typical implementation, the media 900 will be a non-volatile memory such as a CD-ROM or a magnetic hard disk which will retain the programming instructions necessary to perform the various processes of the embodiments of the present invention and will also typically include volatile memory such as DRAM or other memory for storing information which does not have to be permanently saved. This information may include the data 930 after the circuit has been verified.

Thus, a technique for non-equivalence checking of a reference netlist and a test netlist using the subspaces has been described. The larger the number of subspaces used, the higher the probability of being able to identify most if not all of the possible non-equivalences. By limiting the number of variables in the subspaces, it is then possible to put an upper bound on the runtime and memory consumption.

Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A method, comprising:
   comparing a reference netlist with a test netlist to determine cut off points from a set of matched registers in the reference netlist and in the test netlist, the cut off points dividing the reference netlist and the test netlist into multiple reference circuits and test circuits respectively;
   forming primary inputs and outputs at the cut off points;
   forming a plurality of subspaces of inputs using the primary inputs for the reference circuits and the test circuits; and
   identifying non-equivalences between the reference netlist and the test netlist using the plurality of subspaces.

2. The method of claim 1, wherein said identifying the non-equivalences between the reference netlist and the test netlist using the plurality of subspaces comprises identifying non-equivalences between the reference circuits and the corresponding test circuits.

3. The method of claim 1, wherein said forming the plurality of subspaces using the primary inputs for the reference circuits and the test circuits comprises representing the primary inputs for the reference circuits and the test circuits using a number of variables that is fewer than a number of the primary inputs.

4. The method of claim 1, further comprising comparing the reference netlist with the test netlist to determine one or more unmatched registers.

5. The method of claim 4, wherein all unmatched registers not in feedback loops are pushed to the primary inputs or outputs using retiming.

6. The method of claim 4, wherein when all registers in a feedback loop are unmatched registers, the circuit containing the feedback loop is unrolled over a number of cycles to identify the non-equivalences.

7. The method of claim 6, wherein an unmatched register in the feedback loop is unrolled by replacing the unmatched register with a connection from one clock cycle to a next clock cycle over the number of clock cycles to identify the non-equivalences.

8. The method of claim 1, wherein said identifying the non-equivalences between the reference netlist and the test netlist using the plurality of subspaces further comprises:
   identifying a circuit having a stuck-at value; and
   forming a new subspace of inputs to resolve the stuck-at value.

9. The method of claim 8, wherein said forming the new subspace to resolve the stuck-at value comprises forming a circuit having an inverse function to a function of the circuit having the stuck-at value.

10. A computer readable medium containing executable computer program instructions which when executed by a processing system cause said processing system to perform a method comprising:
    comparing a reference netlist with a test netlist to determine cut off points from a set of matched registers in the reference netlist and in the test netlist, the cut off points dividing the reference netlist and the test netlist into multiple reference circuits and test, circuits respectively;
    forming primary inputs and outputs at the cut off points;
    forming a plurality of subspaces of inputs using the primary inputs for the reference circuits and the test circuits; and
    identifying non-equivalences between the reference netlist and the test netlist using the plurality of subspaces.

11. The computer readable medium of claim 10, wherein said identifying the non-equivalences between the reference netlist and the test netlist using the plurality of subspaces comprises identifying non-equivalences between the reference circuits and the corresponding test circuits.

12. The computer readable medium of claim 10, wherein said forming the plurality of subspaces using the primary inputs for the reference circuits and the test circuits comprises representing the primary inputs for the reference circuits and the test circuits using a number of variables that is fewer than a number of the primary inputs.

13. The computer readable medium of claim 10, said method further comprising:
   comparing the reference netlist with the test netlist to determine one or more unmatched registers.

14. The computer readable medium of claim 13, wherein all unmatched registers not in feedback loops are pushed to the primary inputs or outputs using retiming.

15. The computer readable medium of claim 13, wherein when all registers in a feedback loop are unmatched registers, the circuit containing the feedback loop is unrolled over a number of clock cycles to identify the non-equivalences.

16. The computer readable medium of claim 15, wherein an unmatched register in the feedback loop is unrolled by replacing the unmatched register with a connection from one clock cycle to a next clock cycle over the number of clock cycles to identify the non-equivalences.

17. The computer readable medium of claim 10, wherein said identifying the non-equivalences between the reference netlist and the test netlist using the plurality of subspaces further comprises:
   identifying a circuit having a stuck-at value; and
   forming a new subspace of inputs to resolve the stuck-at value.

18. The computer readable medium of claim 17, wherein said forming the new subspace to resolve the stuck-at value comprises forming a circuit having an inverse function to a function of the circuit having the stuck-at value.

19. A system, comprising:
   a memory to store a reference netlist and a test netlist; and
   a processor coupled with the memory, the processor configured to:
      compare the reference netlist with the test netlist to determine cut off points from a set of matched registers in the reference netlist and in the test netlist, the cut off points dividing the reference netlist and the test netlist into multiple reference circuits and test circuits respectively;
      form primary inputs and outputs at the cut off points;
      form a plurality of subspaces of inputs using the primary inputs for the reference circuits and the test circuits; and
      identify non-equivalences between the reference netlist and the test netlist using the plurality of subspaces.

20. The system of claim 19, wherein to identify the non-equivalences between the reference netlist and the test netlist using the plurality of subspaces, the processor is configured to identify non-equivalences between the reference circuits and the corresponding test circuits.

21. The system of claim 20, wherein to identify the non-equivalences between the reference netlist and the test netlist using the plurality of subspaces, the processor is further configured to:
   identify a circuit having a stuck-at value; and
   form a new subspace of inputs to resolve the stuck-at value.

22. The system of claim 21, wherein to form the new subspace to resolve the stuck-at value, the processor is configured to form a circuit having an inverse function to a function of the circuit having the stuck-at value.

23. The system of claim 19, wherein to form the plurality of subspaces using the primary inputs for the reference circuits and the test circuits, the processor is configured to represent the primary inputs for the reference circuits and the test circuits using a number of variables that is fewer than a number of the primary inputs.

24. The system claim 23, wherein a prime number is used in representing the primary inputs for the reference circuits and the test circuits.

25. The system of claim 19, wherein the processor is further configured to compare the reference netlist with the test netlist to determine one or more unmatched registers.

26. The system of claim 25, wherein all unmatched registers not in feedback loops are pushed to the primary inputs or outputs using retiming.

27. The system of claim 25, wherein when all registers in a feedback loop are unmatched registers, the circuit containing the feedback loop is unrolled over number of clock cycles to identify the non-equivalences.

28. The system of claim 27, wherein an unmatched register in the feedback loop is unrolled by replacing the unmatched register with a connection from one clock cycle to a next clock cycle over the number of clock cycles to identify the non-equivalences.

29. A system comprising:
   means for identifying matched registers between a first netlist with a second netlist to form primary inputs;
   means for generating a plurality of subspaces using the primary inputs; and
   means for identifying non-equivalences between the first netlist and the second netlist using the plurality of subspaces.

30. The system claim 29, further comprising means for identifying unmatched registers between the first netlist and the second netlist.

31. The system claim 30, further comprising means for unrolling one or more unmatched registers in one or more feedback loops.

32. The system of claim 31, wherein unrolling is applied a feedback loop when the feedback loop has no matched registers.

33. The system of claim 29, wherein said means for identifying non-equivalences between the first netlist and the second netlist using the plurality of subspaces, further comprising:
   means for identifying circuits having stuck-at values; and
   means for forming new subspaces of inputs to resolve the stuck-at values.

* * * * *